US009673190B2

(12) United States Patent
Cheng et al.

(10) Patent No.: US 9,673,190 B2
(45) Date of Patent: Jun. 6, 2017

(54) ESD DEVICE COMPATIBLE WITH BULK BIAS CAPABILITY

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Terence B. Hook, Terence, VT (US); Ali Khakifirooz, Los Altos, CA (US); Pranita Kerber, Mount Kisco, NY (US); Balasubramanian Pranatharthiharan, Watervliet, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 14/873,859

(22) Filed: Oct. 2, 2015

(65) Prior Publication Data
US 2017/0098646 A1    Apr. 6, 2017

(51) Int. Cl.
*H01L 27/02* (2006.01)
*H01L 29/06* (2006.01)

(52) U.S. Cl.
CPC ...... *H01L 27/0292* (2013.01); *H01L 27/0248* (2013.01); *H01L 27/0255* (2013.01); *H01L 27/0266* (2013.01); *H01L 27/0296* (2013.01); *H01L 29/0653* (2013.01)

(58) Field of Classification Search
CPC ............ H01L 27/0266; H01L 27/0248; H01L 27/0255; H01L 29/0653; H01L 27/0292; H01L 27/0296; H02H 9/046
See application file for complete search history.

(56) References Cited

U.S. PATENT DOCUMENTS

| 7,106,568 | B2* | 9/2006 | Chen | H01L 27/0266 |
| | | | | 257/E29.063 |
| 8,350,329 | B2* | 1/2013 | Campi, Jr. | H01L 27/0274 |
| | | | | 257/355 |
| 8,416,009 | B2 | 4/2013 | Cranford, Jr. et al. | |
| 2005/0224882 | A1* | 10/2005 | Chatty | H01L 29/1083 |
| | | | | 257/355 |
| 2007/0007545 | A1* | 1/2007 | Salcedo | H01L 29/87 |
| | | | | 257/127 |
| 2014/0231624 | A1* | 8/2014 | Shimizu | H01L 27/14643 |
| | | | | 250/208.1 |

* cited by examiner

*Primary Examiner* — Bac Au
(74) *Attorney, Agent, or Firm* — Tutunjian & Bitetto, P.C.; Vazken Alexanian

(57) ABSTRACT

A device having an electrostatic discharge structure includes a bulk substrate having a first dopant conductivity, first wells formed adjacent to a surface of the bulk substrate, including a second dopant conductivity, and second wells formed adjacent to the surface of the bulk substrate within the first wells, including the first dopant conductivity. A supply bus is formed in one of the first wells outside the second well. A ground bus has a first portion formed in another first well outside the second well, and a second portion is formed inside the second well such that a charge input to the second wells is dissipated without accumulating in the bulk substrate.

20 Claims, 5 Drawing Sheets

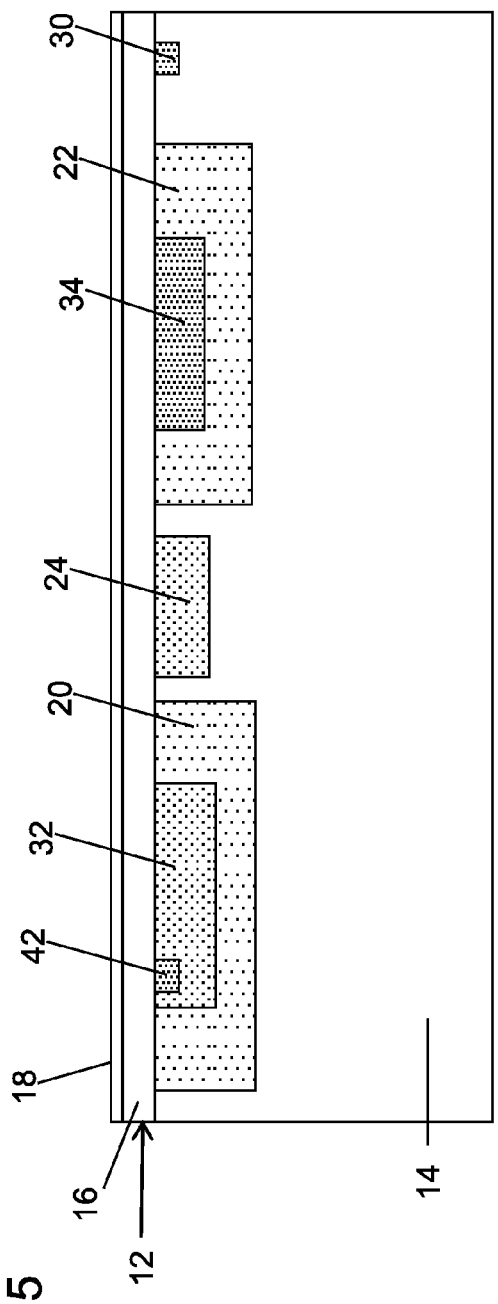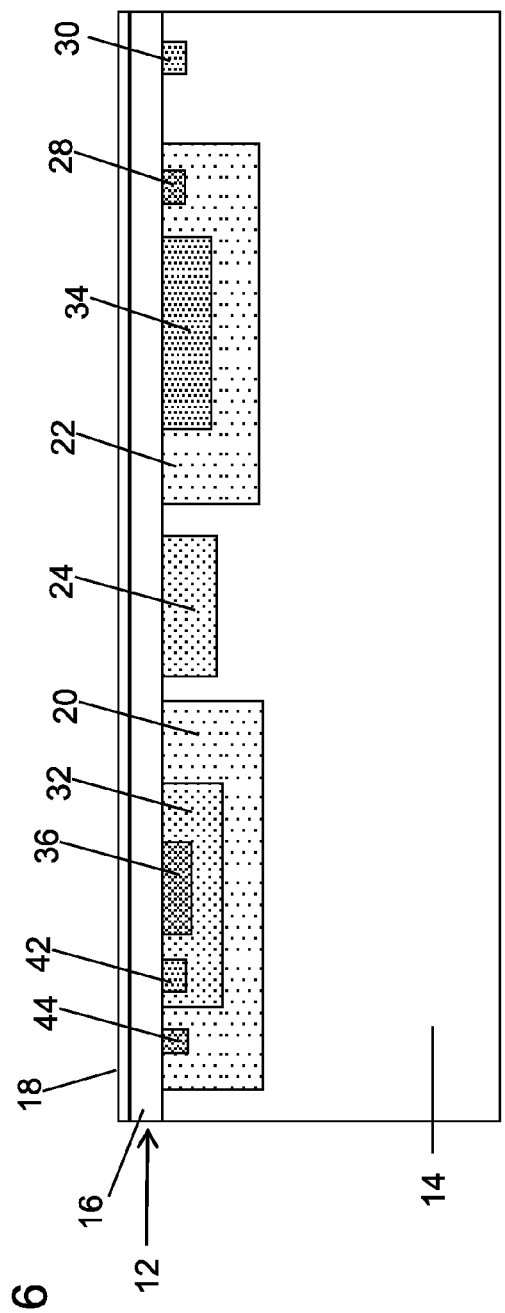

ESD DEVICE COMPATIBLE WITH BULK BIAS CAPABILITY

BACKGROUND

Technical Field

The present invention relates to electrostatic discharge devices, and more particularly to structures and methods for protecting semiconductor devices with discharge to a bulk substrate of a wafer.

Description of the Related Art

Electrostatic discharge (ESD) protection may be afforded in semiconductor devices by dumping charge into large power supply buses. This charge dump dissipates energy in large capacitances provided by the large power supply buses. The ESD dump is sometimes accomplished by a pair of up- and down-diodes, where the up-diode directs positive pulses into a supply voltage bus (Vdd or VDD) and is normally off. The down-diode directs negative-going pulses into a ground bus, and is also normally off.

In conventional semiconductor-on-insulator (SOI) technology standard diodes may be used. However, in extremely thin SOI (ETSOI) substrates, it is advantageous to use devices built in bulk silicon for improved power dissipation rather than the extremely thin semiconductor layer. In some manifestations of ESD circuits, a bias voltage may be applied to a bulk wafer instead of chip ground, and in that case, the negative-going pulse should not be dumped into the bulk. In such a case, the bulk wafer is not chip ground, but is instead isolated from chip ground by a pump circuit.

SUMMARY

A device having an electrostatic discharge structure includes a bulk substrate having a first dopant conductivity, first wells formed adjacent to a surface of the bulk substrate, including a second dopant conductivity, and second wells formed adjacent to the surface of the bulk substrate within the first wells, including the first dopant conductivity. A supply bus is formed in one of the first wells outside the second well. A ground bus has a first portion formed in another first well outside the second well, and a second portion is formed inside the second well such that a charge input to the second wells is dissipated without accumulating in the bulk substrate.

Another device having an electrostatic discharge structure (ESD) includes an extremely thin semiconductor-on-insulator (ETSOI) including a bulk substrate having a first dopant conductivity; and an ESD structure including a positive pulse region configured to dissipate charge to a supply voltage bus and a negative pulse region configured to dissipate charge to a ground bus such that a charge input is dissipated without accumulating in the bulk substrate. The positive pulse region includes a first well formed adjacent to a surface of the bulk substrate and including a second dopant conductivity; and a second well formed adjacent to the surface of the bulk substrate within the first well and including the first dopant conductivity, the supply bus being formed in the first wells outside the second well. The negative pulse region includes a first well formed adjacent to the surface of the bulk substrate and including the second dopant conductivity, and a second well formed adjacent to the surface of the bulk substrate within the first well and including the first dopant conductivity. The ground bus has a first portion formed in the first well outside the second well and a second portion formed inside the second well.

A method for forming an electrostatic discharge (ESD) structure includes forming first wells adjacent to a surface of a bulk substrate where the bulk substrate includes a first dopant conductivity and the first wells include a second dopant conductivity; forming second wells with the first dopant conductivity adjacent to the surface of the bulk substrate within the first wells; forming a supply bus in one of the first wells outside the second well; and forming a ground bus having a first portion formed in another first well outside the second well and a second portion formed inside the second well wherein the ESD structure is configured to input charge to the second wells to dissipate the charge without charge accumulation in the bulk substrate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view of the ESD structure of FIG. 4 showing the formation of another second well, a portion of a ground bus and a bias generation node in accordance with the present principles;

FIG. 6 is a cross-sectional view of the ESD structure of FIG. 5 showing the formation of a connection region, another portion of the ground bus and a supply voltage bus in accordance with the present principles.

DETAILED DESCRIPTION

Figure 1:
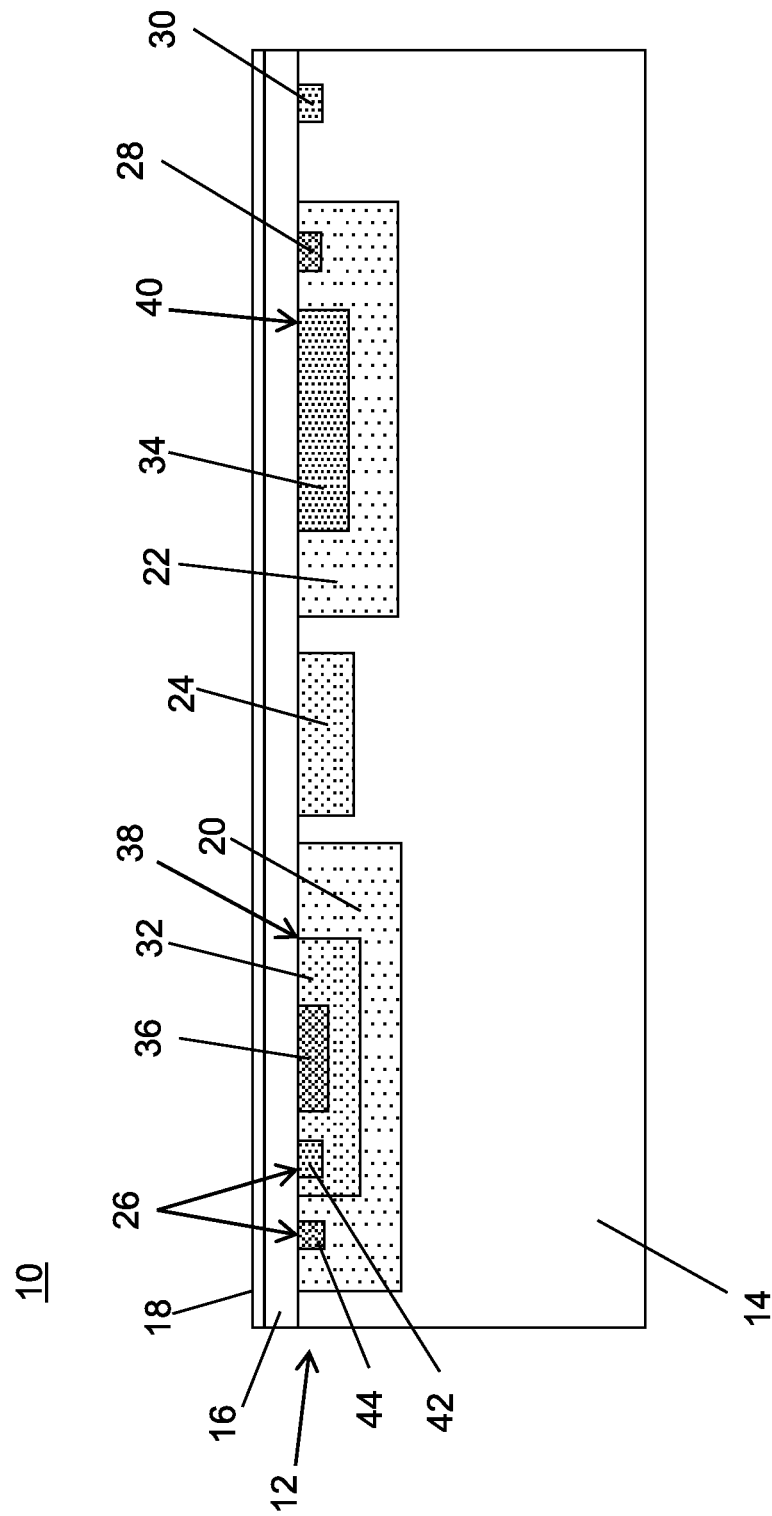
FIG. 1 is a cross-sectional view of an extremely thin semiconductor-on-insulator (ETSOI) substrate having triple well electrostatic discharge (ESD) structures in accordance with the present principles.

In accordance with the present principles, structures and methods for fabricating these structures are provided for electrostatic discharge in semiconductor devices. In useful embodiments, a triple well structure is employed in wafer bulk of an extremely thin semiconductor-on-insulator (ETSOI) semiconductor, to direct a positive ESD pulse into a voltage supply (VDD) bus, and a negative ESD pulse into a ground (GND) bus, and not into the wafer bulk at all. ESD current in the wafer bulk can result in bulk bias variations (e.g., due to charge depletion), floating ground issues and charge build-up in a wafer. ESD current should not be directed into the wafer bulk especially if the wafer bulk is isolated from chip ground and powered by a pump circuit. The triple well structure for ESD protection directs discharge current into the chip ground and power busses and avoids dumping charge into the wafer bulk.

In one embodiment, a selective surface doping layer is provided to enable formation of the triple well structure while also enabling bulk bias modulation without depletion. The selective surface doping may employ a same implant as used for a backgate and a triple well p well region. The backgate implant needs to be adequately spaced away from an n well region to permit adequate breakdown and minimal leakage of the n well regions.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a semiconductor device 10 that prevents electrostatic discharge in a bulk wafer is illustratively shown in accordance with one exemplary embodiment. The device 10 includes an extremely thin semiconductor-on-insulator (ETSOI) semiconductor substrate 12 although other substrates and architectures may be employed. The substrate 12 includes a bulk substrate 14 (also referred to herein as a bulk wafer). The bulk substrate 14 includes a semiconductor material, preferably a monocrystalline material. The bulk substrate 14 may include Si, SiGe, SiC, Ge, GaAs, GaN or other suitable materials (e.g., other III-V materials, etc.). The substrate 12 includes a buried dielectric layer 16. The buried dielectric layer may include an oxide, although other dielectric materials may also be employed. The substrate 12 also includes an extremely thin semiconductor layer 18. The semiconductor layer 18 may include Si, SiGe, SiC, Ge, GaAs, GaN or other suitable materials.

Dumping of charge to the bulk substrate 14 is to be avoided, and this is provided in accordance with the present principles by employing a triple well structure 38 for a limiting charge to a ground bus 26. The ground bus (GND) 26 includes two portions 42, 44. One portion 44 is within a first doped well 20, and another portion 42 is within a second doped well 32. An input connection is made to a connection region 36 to provide a discharge current to a down diode formed by the triple well structure 38.

In one embodiment, the triple well structure 38 includes alternating dopant conductivities for each adjacent region. In addition, the dopant concentration may decrease with depth into the bulk substrate 14 for each respective doped region. The triple well structure 38 for the ground connection 26 includes the bulk substrate 14 and two other well regions, e.g., the first doped well 20 and the second doped well 32.

In one embodiment, the bulk substrate 14 may include p-type doping with a dopant concentration of about $1 \times 10^{16}/cm^3$. The bulk substrate 14 may have a substrate bias of between, e.g., $-2$ to $-5$ volts. The connection region 36 includes an n+ doped region, and may include a dopant concentration of about $1 \times 10^2/cm^3$. The second region 32 may include a p doped region, and may include a dopant concentration of about $1 \times 10^{18}/cm^3$. The first region 20 includes an n doped region, and may include a dopant concentration of about $1\times10^{17}/cm^3$. The portions 42, 44 of the ground bus 26 may include the same conductivities as the well regions in which they are formed. For example, the portion 42 includes p doping with a concentration greater than the second well region 32. The dopant concentration of the portion 42 may be about $1\times10^{20}/cm^3$. The portion 44 includes n+ doping with a concentration greater than the first region 20. The dopant concentration of the portion 44 may be about $1\times10^{20}/cm^3$.

A triple well structure 40 for a supply voltage bus 28 includes the bulk substrate 14 and two other well regions, e.g., a first doped well 22 and a second doped well 34. An input connection is made to the second doped well 34 to provide an up diode formed by the triple well structure 40, which connects to the supply voltage bus 28.

The second doped region 34 may include a p+ doped region, and may include a dopant concentration of about $1\times10^{20}/cm^3$. The first doped region 22 includes an n doped region, and may include a dopant concentration of about $1\times10^{17}/cm^3$. The supply bus (VDD) 28 may include the same conductivity as the well region in which it is formed. For example, the supply bus 28 includes n+ doping with a concentration greater than the first well region 22. The dopant concentration of the supply bus 28 may be about $1\times10^{20}/cm^3$. Other dopant concentrations may also be employed.

A back gate 24 includes a doped region configured to provide control of source-to-bulk parasitic transistors. The backgate 24 is biased to adjust the threshold voltages of devices formed on the substrate 12. In one embodiment, a same implant may be employed to concurrently form the back gate 24 as well as the second doped region 32 of the triple well structure 38. The implant used to form the backgate 24 needs to be spaced adequately away from regions 20 and 22 to permit adequate breakdown and minimal leakage of the regions 20 and 22 (e.g., n-wells).

The back gate 24 along with a bias generator circuit controls bias of the bulk substrate 14 through a node connection 30. The node connection 30 may include the same dopant concentration and conductivity as the doped region 34. The bias generator enables bulk bias modulation without depletion by controlling a bias voltage of the bulk substrate 14. Biasing of the bulk by application of a voltage to the substrate 14 is desirable to minimize leakage and prevent soft turn-ons of field effect transistors. In accordance with the present principles, charge is delivered to the bus lines 26 and 28 without dumping charge into the bulk substrate 14 directly.

The ESD structure includes a positive pulse region 40 configured to dissipate charge to the supply voltage bus 28, and a negative pulse region 38 configured to dissipate charge to the ground bus 26 such that a charge input is dissipated without accumulating in the bulk substrate.

It should be understood that while the structures in accordance with the present principles have been described having certain doping conductivities, the present principles contemplate embodiments where the dopant conductivities are reversed.

Figure 2:
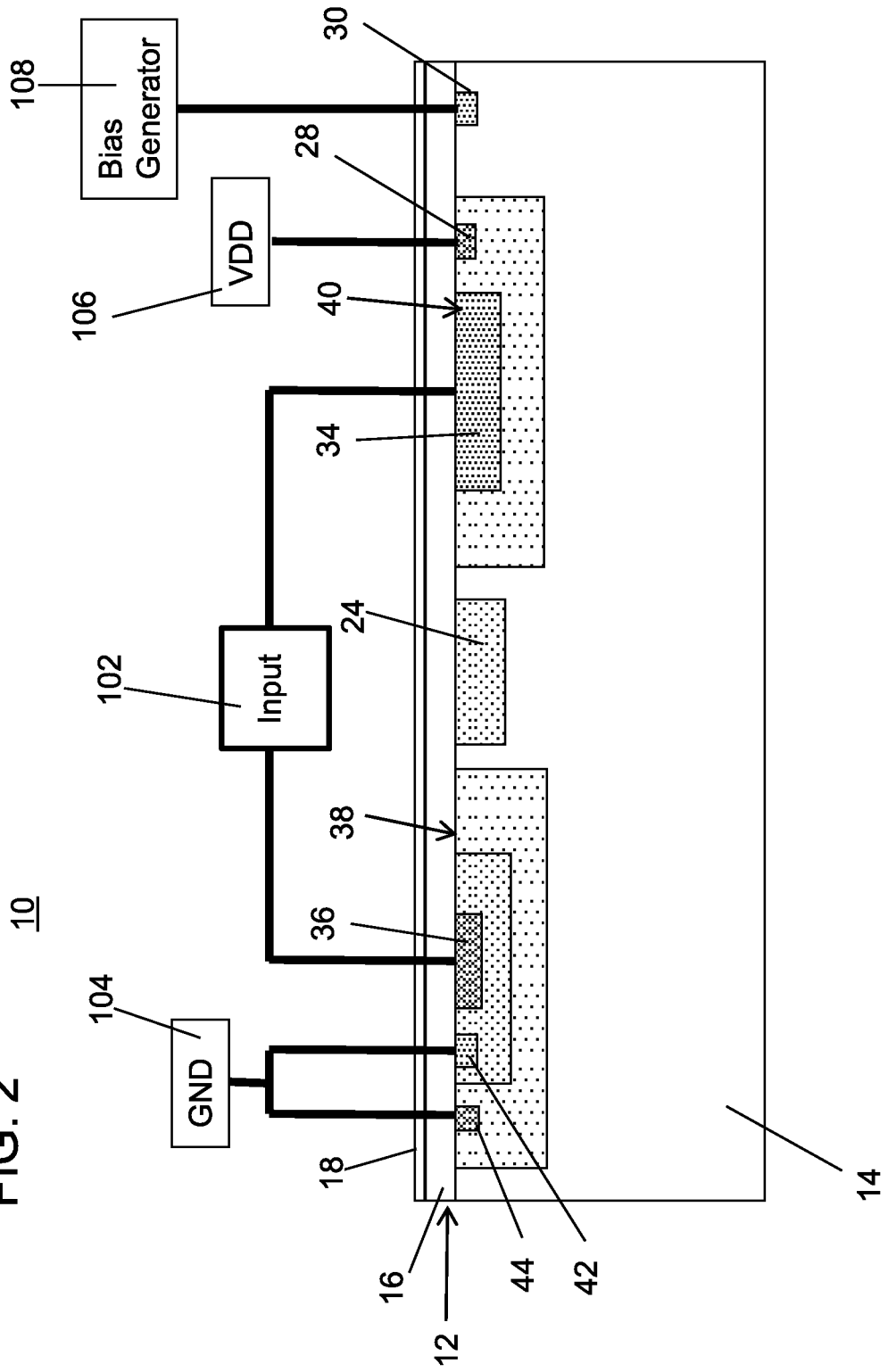
FIG. 2 is a schematic view with the cross-sectional view of FIG. 1 showing circuit components coupled to the triple well ESD structures in accordance with the present principles.

Referring to FIG. 2, a schematic diagram shows circuit components connecting with doped regions in the bulk substrate 14 of substrate 12. Electrostatic discharge is delivered by an input pad 102 to connection point 36 on the ground side and/or to region 34 of the supply voltage side. The regions 42 and 44 form the ground bus 104 (GND) and the region 28 forms the supply voltage bus (VDD). A bias generator circuit 108 connects to the connection node 40 to bias the voltage of the bulk substrate 14. The components (e.g., 102, 104, 106, 108) may be fully or partially formed in bulk substrate 14 and/or on the ET semiconductor layer 18.

The structure of FIG. 2 employs the triple well structures 38, 40 in the bulk 14 of an ETSOI semiconductor, to direct a positive ESD pulse from input pad 102 into the VDD bus 28, and a negative ESD pulse from input pad 102 into the GND bus 26, and not into the wafer bulk 14 at all.

Referring to FIGS. 3-6, an illustrative method for forming dopant regions for an ESD device compatible with bulk bias capability is illustratively shown. In the present example, the bulk substrate is p-doped; however in other embodiments, the bulk substrate 14 may be n-doped and the conductivities as described hereafter would be reversed.

Figure 3:
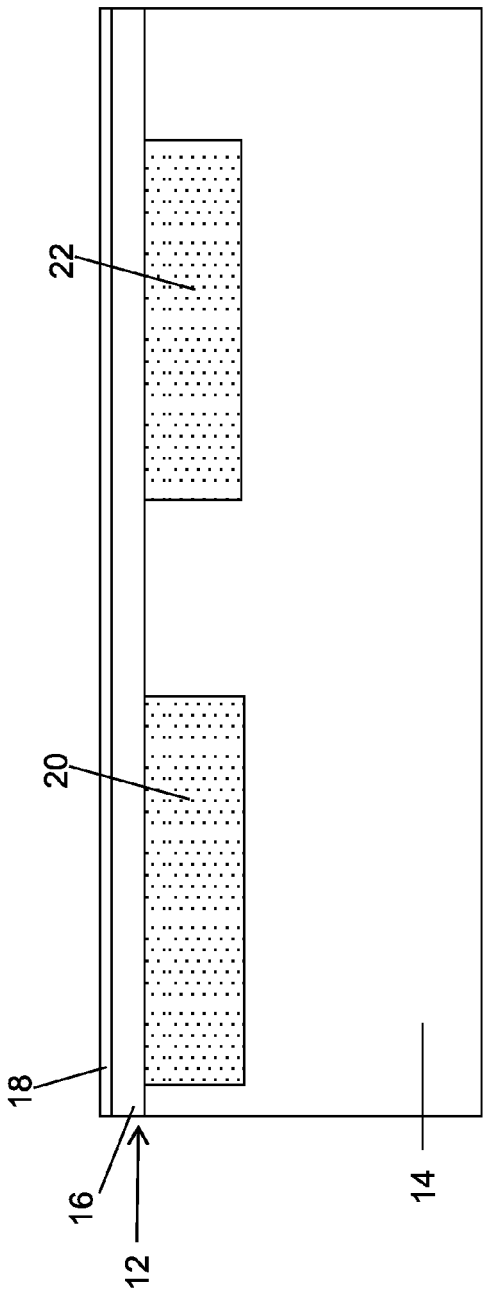
FIG. 3 is a cross-sectional view of an ESD structure after forming first wells in accordance with the present principles.

Referring to FIG. 3, regions 20 and 22 are concurrently formed. In one embodiment, an ion implantation process may be performed using a dopant mask (not shown) to form distinct regions 20 and 22. The regions 20, 22 form n-wells in this embodiment with a dopant concentration of about $1\times10^{17}/cm^3$. Other dopant concentrations may be employed.

Figure 4:
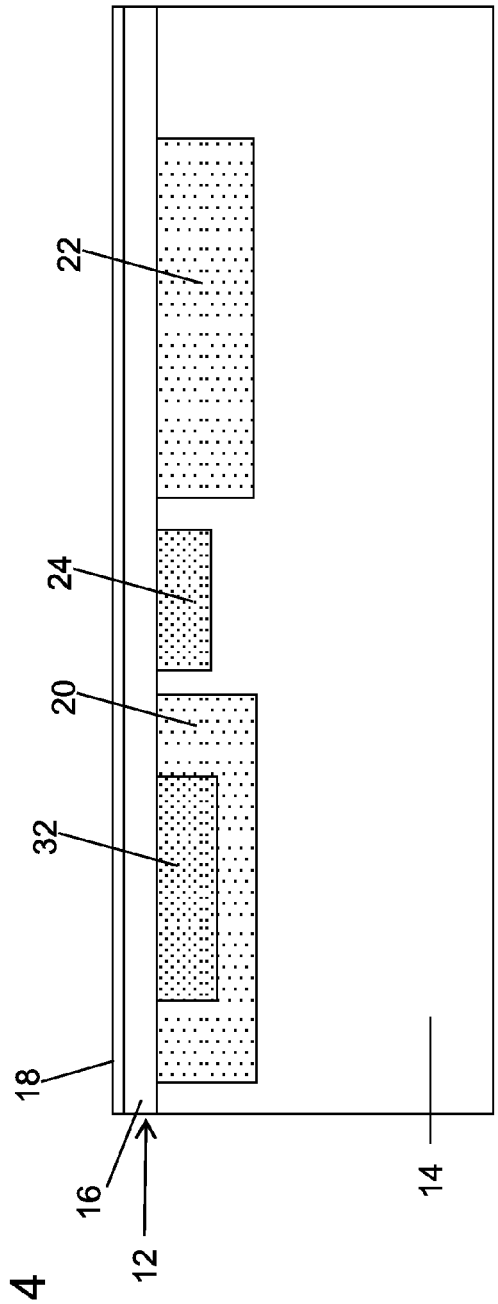
FIG. 4 is a cross-sectional view of the ESD structure of FIG. 3 showing the formation of one second well with a back gate in accordance with the present principles.

Referring to FIG. 4, backgate 24 and region 32 are concurrently formed. In one embodiment, an ion implantation process may be performed using a dopant mask (not shown) to form backgate 24 and region 32. Region 32 is preferably centered within region 20. The backgate 24 and regions 20 form p-wells in this embodiment with a dopant concentration of about $1\times10^{18}/cm^3$. Other dopant concentrations may be employed while maintaining relative dopant concentrations with neighboring wells/regions.

Referring to FIG. 5, region 34 and possibly regions 30 and 42 may be concurrently formed. In one embodiment, an ion implantation process may be performed using a dopant mask (not shown) to form regions 34, 30 and 42. Region 34 is preferably centered within region 22. The regions 34 form a p-well in this embodiment with a dopant concentration of about $1\times10^{20}/cm^3$. Other dopant concentrations may be employed while maintaining relative dopant concentrations with neighboring wells/regions. Region 42 forms a portion of the ground bus and includes a same dopant type and concentration as region 34. Region 30 forms a connection node for a bias generation circuit and includes a same dopant type and concentration as region 34.

Referring to FIG. 6, region 36 and possibly regions 28 and 44 may be concurrently formed. In one embodiment, an ion implantation process may be performed using a dopant mask (not shown) to form regions 36, 28 and 44. Region 36 is preferably centered within region 32. The regions 36 include n-type dopants in this embodiment with a dopant concentration of about $1\times10^{20}/cm^3$. Other dopant concentrations may be employed while maintaining relative dopant concentrations with neighboring wells/regions. Region 44 forms a portion of the ground bus and includes a same dopant type and concentration as region 36. Region 28 forms a supply voltage bus and includes a same dopant type and concentration as region 36. Processing continues to complete the device.

Figure 7:
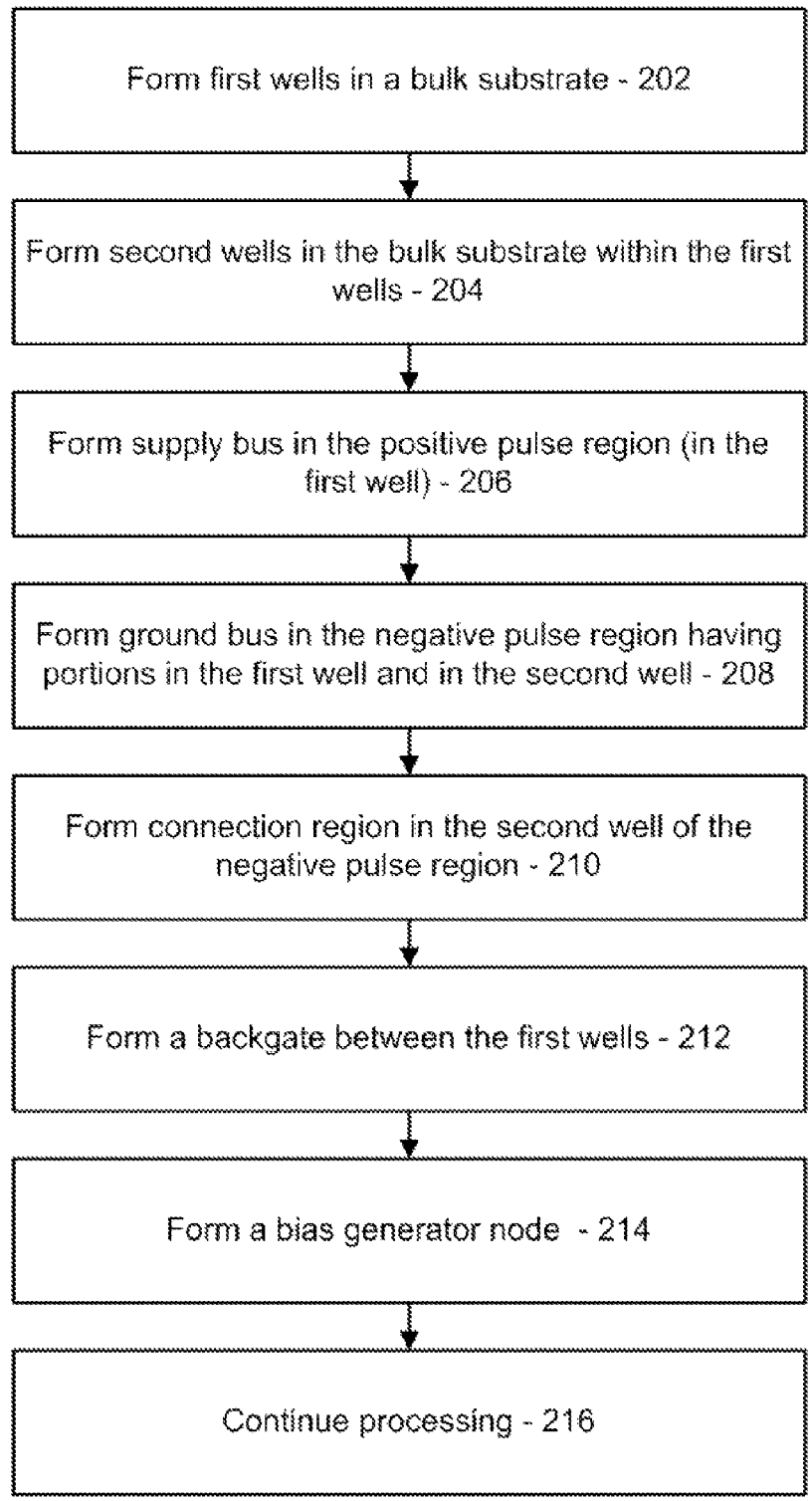
FIG. 7 is a block/flow diagram showing methods for forming an electrostatic discharge (ESD) structure in accordance with illustrative embodiments.

Referring to FIG. 7, methods for forming an electrostatic discharge (ESD) structure are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, first wells are formed adjacent to a surface of a bulk substrate where the bulk substrate includes a first dopant conductivity and the first wells include a second dopant conductivity. The first wells may be formed using an ion implantation process. In block 204, second wells are formed with the first dopant conductivity adjacent to the surface of the bulk substrate within the first wells. The second wells are preferably centered within the first wells. The second wells may be formed using an ion implantation process. The second wells may include different dopant concentrations and be formed using different processes. In useful embodiments, the first wells may include a dopant concentration that is greater than the bulk substrate, and the first wells may include a dopant concentration that is less than the second wells.

In block 206, a supply bus is formed in a positive pulse region. The supply bus is formed in one of the first wells, but outside the second well in the positive pulse region. In block 208, a ground bus is formed in a negative pulse region with a first portion formed in its first well outside the second well and a second portion of the ground bus formed inside the second well. The ESD structure is configured to input charge to the second wells to dissipate the charge without charge accumulation in the bulk substrate.

In block 210, a connection region is formed in the second well of the negative pulse region. The connection region is spaced apart from the second portion of the ground bus. The connection region includes the second dopant conductivity and connects to the charge input or input pad. In block 212, a backgate is formed between the first wells and is configured to reduce leakage of the first wells. The backgate and the second well with the ground bus may be formed concurrently with a same implant. In block 214, a bias generator node is formed in the bulk substrate.

In one embodiment, the connection region, the first portion of the ground bus and the supply bus may be formed in a same implant process. In one embodiment, the second portion of the ground bus and a bias generator node may be formed in a same implant process. In block 216, processing continues to complete the device. This may include forming devices (e.g., transistors, etc. including bias generator circuits and the like), metallizations, etc.

Having described preferred embodiments for an ESD device compatible with bulk bias capability (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A device having an electrostatic discharge structure, comprising:
   a bulk substrate having a first dopant conductivity;
   first wells formed adjacent to a surface of the bulk substrate and including a second dopant conductivity;
   second wells formed adjacent to the surface of the bulk substrate within the first wells and including the first dopant conductivity;
   a supply bus formed in one of the first wells outside the second well; and
   a ground bus having a first portion formed in another first well outside the second well and a second portion formed inside the second well such that a charge input to the second wells is dissipated without accumulating in the bulk substrate.

2. The device as recited in claim 1, further comprising a connection region formed in the second well including the portion of the ground bus, the connection region having the second dopant conductivity and connecting to the charge input.

3. The device as recited in claim 1, further comprising a backgate disposed between first wells and configured to reduce leakage of the first wells.

4. The device as recited in claim 1, further comprising a bias generation node formed in the bulk substrate to modulate bias voltage in the bulk substrate.

5. The device as recited in claim 1, wherein the first wells include a dopant concentration that is greater than the bulk substrate.

6. The device as recited in claim 1, wherein the first wells include a dopant concentration that is less than the second wells.

7. The device as recited in claim 1, wherein the bulk substrate includes a semiconductor-on-insulator (SOI) structure.

8. The device as recited in claim 7, wherein the surface of the bulk substrate contacts a buried dielectric layer of the SOI structure.

9. A device having an electrostatic discharge structure (ESD), comprising:
   an extremely thin semiconductor-on-insulator (ETSOI) including a bulk substrate having a first dopant conductivity; and
   an ESD structure including a positive pulse region configured to dissipate charge to a supply voltage bus and a negative pulse region configured to dissipate charge to a ground bus such that a charge input is dissipated without accumulating in the bulk substrate;
   the positive pulse region including:
      a first well formed adjacent to a surface of the bulk substrate and including a second dopant conductivity;
      a second well formed adjacent to the surface of the bulk substrate within the first well and including the first dopant conductivity;
      the supply bus being formed in the first wells outside the second well; and
   the negative pulse region including:
      a first well formed adjacent to the surface of the bulk substrate and including the second dopant conductivity;
      a second well formed adjacent to the surface of the bulk substrate within the first well and including the first dopant conductivity; and
      the ground bus having a first portion formed in the first well outside the second well and a second portion formed inside the second well.

10. The device as recited in claim 9, further comprising a connection region formed in the second well including the portion of the ground bus, the connection region having the second dopant conductivity and connecting to the charge input.

11. The device as recited in claim 9, further comprising a backgate disposed between the first wells and configured to reduce leakage of the first wells.

12. The device as recited in claim 9, further comprising a bias generation node formed in the bulk substrate to modulate bias voltage in the bulk substrate.

13. The device as recited in claim 9, wherein the first wells include a dopant concentration that is greater than the bulk substrate.

14. The device as recited in claim 9, wherein the first wells include a dopant concentration that is less than the second wells.

15. The device as recited in claim 9, wherein the surface of the bulk substrate contacts a buried dielectric layer of the ETSOI structure.

16. A method for forming an electrostatic discharge (ESD) structure, comprising:
   forming first wells adjacent to a surface of a bulk substrate where the bulk substrate includes a first dopant conductivity and the first wells include a second dopant conductivity;
   forming second wells with the first dopant conductivity adjacent to the surface of the bulk substrate within the first wells;
   forming a supply bus in one of the first wells outside the second well; and
   forming a ground bus having a first portion formed in another first well outside the second well and a second portion formed inside the second well wherein the ESD structure is configured to input charge to the second wells to dissipate the charge without charge accumulation in the bulk substrate.

17. The method as recited in claim 16, further comprising forming a connection region in the second well including the second portion of the ground bus, the connection region having the second dopant conductivity and connecting to the charge input.

18. The method as recited in claim 16, further comprising forming a backgate disposed between first wells and configured to reduce leakage of the first wells.

19. The method as recited in claim 16, wherein forming the backgate includes forming the backgate and the second well with the ground bus concurrently with a same implant.

20. The method as recited in claim 16, wherein the first wells include a dopant concentration that is greater than the bulk substrate and the first wells include a dopant concentration that is less than the second wells.

* * * * *